United States Patent
Kim

(10) Patent No.: US 7,894,287 B2
(45) Date of Patent: Feb. 22, 2011

(54) SEMICONDUCTOR MEMORY DEVICE CONTROLLING A VOLTAGE SUPPLIED TO A DUMMY BIT LINE

(75) Inventor: Young Soo Kim, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 268 days.

(21) Appl. No.: 11/968,729

(22) Filed: Jan. 3, 2008

(65) Prior Publication Data
US 2009/0091989 A1    Apr. 9, 2009

(30) Foreign Application Priority Data
Oct. 5, 2007    (KR)    ................... 10-2007-0100221

(51) Int. Cl.
*G11C 7/12*    (2006.01)
(52) U.S. Cl. .................. 365/210.12; 365/210.1; 365/203; 365/202; 365/189.09
(58) Field of Classification Search ............ 365/189.09, 365/210.12, 210.1, 203, 202
See application file for complete search history.

(56) References Cited

U.S. PATENT DOCUMENTS

| 5,268,869 | A * | 12/1993 | Ferris et al. | ............... 365/205 |
| 7,116,597 | B1 * | 10/2006 | Goldman et al. | ....... 365/210.12 |
| 2004/0136256 | A1 * | 7/2004 | Dadashev | ............... 365/210 |
| 2007/0008771 | A1 * | 1/2007 | Lee et al. | ............... 365/154 |

FOREIGN PATENT DOCUMENTS

| KR | 1000060027 B1 | 9/1992 |
| KR | 1998-0076175 A | 11/1998 |
| KR | 1999-0060755 A | 7/1999 |

* cited by examiner

*Primary Examiner*—Andrew Q Tran
(74) *Attorney, Agent, or Firm*—Ladas & Parry LLP

(57) ABSTRACT

The present invention relates to a semiconductor memory device, and more precisely to a semiconductor memory device which controls the voltage supplied to a dummy bit line and a biasing method. The semiconductor memory device includes a dummy bit line disposed in a cell array and a switching unit which switches the supply of a bias voltage to the dummy bit line by a control signal related to an operation of the cell array.

20 Claims, 4 Drawing Sheets

SEMICONDUCTOR MEMORY DEVICE CONTROLLING A VOLTAGE SUPPLIED TO A DUMMY BIT LINE

CROSS-REFERENCE TO RELATED APPLICATIONS

The present application claims priority to Korean patent application number 10-2007-0100221 filed on Oct. 5, 2007, which is incorporated herein by reference in its entirety.

BACKGROUND OF THE INVENTION

The present invention relates to a semiconductor memory device, and more particularly to a semiconductor memory device which controls the voltage supplied to a dummy bit line and a biasing method thereof.

In general, a semiconductor device utilizes a dummy bit line that is not intended for performing operational functions but for the purposes of advantageous manufacturing processes. These process advantages can be largely divided into two types.

First, it is possible to compensate a height difference in a vertical section between a cell array area and a peripheral circuit area. Second, it is possible to realize an environment similar to that in which normal bit lines are repeated in the edges of a normal cell array area since the edges of the normal cell array area are weak.

FIG. 1 illustrates a cell array of a general memory device including a dummy bit line and FIG. 2 illustrates a voltage applying unit which applies a voltage to the dummy bit line.

In general, a semiconductor memory device includes a memory cell array block having a plurality of unit memory cells connected to a word line and a bit line to store data, a bit line isolation unit which isolates and connects the bit line and a bit line sense amplifier, an equalization/precharge unit which precharges a bit line pair and maintains equal voltage levels in the bit line pair, and the bit line sense amplifier which senses and amplifies a difference in the voltage levels between the bit line pair. FIG. 1 illustrates a layout of the memory cell array block of the semiconductor memory device in which only an active area and node contacts are shown and units not in direct relation to the present invention are not shown.

Referring to FIG. 1, a memory cell array is formed with an active area 10 and the active area 10 is formed with a storage node landing plug contact (LPC) a bit line node LPC and a bit line node contact thereon.

The LPCs are contacts which are firstly perforated in a silicon substrate and it should not be electrically shorted with a gate material upon contact. The generation of the short causes many problems, which will be described herein.

An operation in which a bias is applied to bit lines BL and BLb and a dummy bit line DBL will be described with reference to FIG. 2.

Referring to FIG. 2, the semiconductor memory device is formed with an upper bit line precharge/equalization unit 10, an upper bit line isolation unit 20, a bit line sense amplifier 30, a column selection unit 40, a lower bit line isolation unit 50 and a lower bit line equalization unit 60 between an upper cell array 1 and a lower cell array 2.

The upper bit line precharge/equalization unit 10 is provided with NMOS transistors N3 and N4 which precharge the bit line pair BL and BLb to a bit line precharge voltage VBLP (generally, Vdd/2) using a bit line equalization signal BLEQ as a gate input and an NMOS transistor N0 which equalizes the bit line pair BL and BLb using the bit line equalization signal BLEQ as a gate input.

The upper bit line isolation unit 20 is for selectively isolating the bit line sense amplifier 30 and the bit line pair BL and BLb of the upper cell array 1, and includes two NMOS transistors N1 and N2 which use an upper bit line isolation signal BISH as a gate input.

The bit line sense amplifier 30 is for amplifying data on the bit line pair and, although there exists various types, is generally provided with two PMOS transistors connected between a pull-up power source RTO and the bit line pair and two NMOS transistors connected between a pull-down power source Sb and the bit line pair.

The column selection unit 40 selectively connects the bit line pair BL and BLb and segment data bus pair SIO and SIOb in response to a column selection signal CY.

The lower bit line isolation unit 50 is for selectively isolating the bit line sense amplifier 30 and the bit line pair BL and BLb of the lower cell array 2, and includes two NMOS transistors N5 and N6 which use a lower bit line isolation signal BISL as a gate input.

The lower bit line equalization unit 60 includes an NMOS transistor N7 which equalizes the lower bit line pair using the bit line equalization signal BLEQ as a gate input.

In the above described structure, when an active command is applied, the bit line equalization signal BLEQ is inactivated to a logic level "low" to turn off the NMOS transistors N0, N3, N4 and N7. Therefore, the bit line pair is floated from the precharge voltage VBLP. At this time, the normal bit line is in a state of being floated with the precharge voltage VBLP but the dummy bit line is continuously supplied with the precharge voltage VBLP since the dummy bit line is in direct connection with the precharge voltage VBLP. In other words, the precharge voltage VBLP is applied not to the normal bit line BL but to the dummy bit line DBL when the active command is applied. Such a biasing method causes many problems as the size of a sub word line is decreased.

These problems will be described with reference to FIG. 3.

FIG. 3A illustrates a case that a LPC short 31 is generated between a dummy bit line and a word line; FIG. 3B illustrates a case that a LPC short 32 is generated between a storage node a and a word line when a MOS transistor is on; and FIG. 3C illustrates a case that a LPC short 33 is generated between a word line of a data cell which is not selected and a storage node a.

In the cases in which the aforementioned short is generated upon application of an active command, as shown in FIGS. 3A and 3B, an enabled word line voltage VPP and a precharge voltage VBLP applied to the dummy bit line are in conflict with each other to lower the word line voltage VPP.

Also, when a precharge command is applied, as shown in FIG. 3C, a disabled word line voltage VSS and a precharge voltage VBLP applied to the dummy bit line are in conflict with each other to raise the word line voltage VSS.

This LPC short may cause many problems. For example, when the word line voltage VPP is lowered due to the short as shown in FIGS. 3A and 3B, the write recovery time (tWR) worsens. Also, when the voltage of the word line in which a ground voltage level should be maintained is raised as shown in FIG. 3C, a defect is generated creating unnecessary current flow.

SUMMARY OF THE INVENTION

The present invention prevents the generation of a defect due to a short by controlling the voltage applied to a dummy bit line.

Also, the present invention allows to float the dummy bit line with a precharge voltage and thus cut off the voltage supply when an active command is applied.

According to a first aspect of the present invention, there is provided a semiconductor memory device, which includes: a dummy bit line disposed in a cell array; and a switching unit which switches the supply of a bias voltage to the dummy bit line by a control signal related to an operation of the cell array.

Preferably, the switching unit is turned off when an active command is applied to the cell array.

Preferably, the switching unit is turned on when a precharge command is applied to the cell array.

The switching unit may include an NMOS transistor.

Preferably, a control signal, which is activated to a high level when a precharge command is applied to the cell array, is applied to a gate of the NMOS transistor and the bias voltage is applied to a drain or a source of the NMOS transistor.

Preferably, the NMOS transistor is disposed between the dummy bit line and a normal bit line and forms a common gate with an equalization transistor which equalizes the normal bit line pair.

Preferably, the signal which is applied to the gate is a bit line equalization signal.

Preferably, the bias voltage is a precharge voltage.

According to a second aspect of the present invention, there is provided a semiconductor memory device, which includes: a cell array and a voltage supply unit, wherein the cell array includes a switching unit which supplies a voltage supplied from the voltage supply unit to a dummy bit line disposed in the cell array.

Preferably, the switching unit is turned off to thereby cut off the voltage supply to the dummy bit line when an active command is applied to the cell array.

Preferably, the switching unit is turned on to the voltage supplied to the dummy bit line when a precharge command is applied to the cell array.

Preferably, the switching unit includes an NMOS transistor.

Preferably, a control signal which is activated to a high level when a precharge command is applied to the cell array is applied to a gate of the NMOS transistor and the voltage is applied to a drain or a source of the NMOS transistor from the voltage supply.

Preferably, the NMOS transistor is disposed between the dummy bit line and a normal bit line and forms a common gate with an equalization transistor which equalizes the normal bit line pair.

Preferably, the signal applied to the gate may be a bit line equalization signal.

Preferably, the bias voltage is a precharge voltage.

According to a third aspect of the present invention, there is provided a semiconductor memory device, which includes: a cell array; a dummy bit line disposed in the cell array; a voltage supply unit which supplies a voltage to the dummy bit line; and a switching unit which is disposed between the voltage supply unit and the dummy bit line and switches a voltage supplied to the dummy bit line.

Preferably, the switching unit is turned off to thereby cut off the voltage supply to the dummy bit line when an active command is applied to the cell array.

Preferably, the switching unit is turned on to allow the voltage to be supplied to the dummy bit line when a precharge command is applied to the cell array.

Preferably, the switching unit is controlled to be turned on or off by a control signal related to an operation of the cell array.

Preferably, the switching unit includes an NMOS transistor provided with a gate to which a control signal is applied, the control signal being activated to a high level when a precharge command is applied to the cell array, and a drain or a source to which the voltage of the voltage supply is applied.

Preferably, the switching unit includes an NMOS transistor which forms a common gate with an equalization transistor which equalizes the bit line pair disposed in the cell array.

Preferably, the voltage supply unit supplies a precharge voltage.

Preferably, according to a third aspect of the present invention, there is provided a method of biasing a semiconductor device, which includes the steps of: supplying a voltage to a normal bit line of a cell array; and floating a dummy bit line from the voltage when an active command is applied to the cell array and supplying the voltage to the dummy bit line when a precharge command is applied to the cell array.

Preferably, the voltage supplied to the bit line is a precharge voltage.

DESCRIPTION OF SPECIFIC EMBODIMENTS

Hereinafter, preferred embodiments of the present invention will be described in detail with reference to the accompanying drawings.

Figure 1:
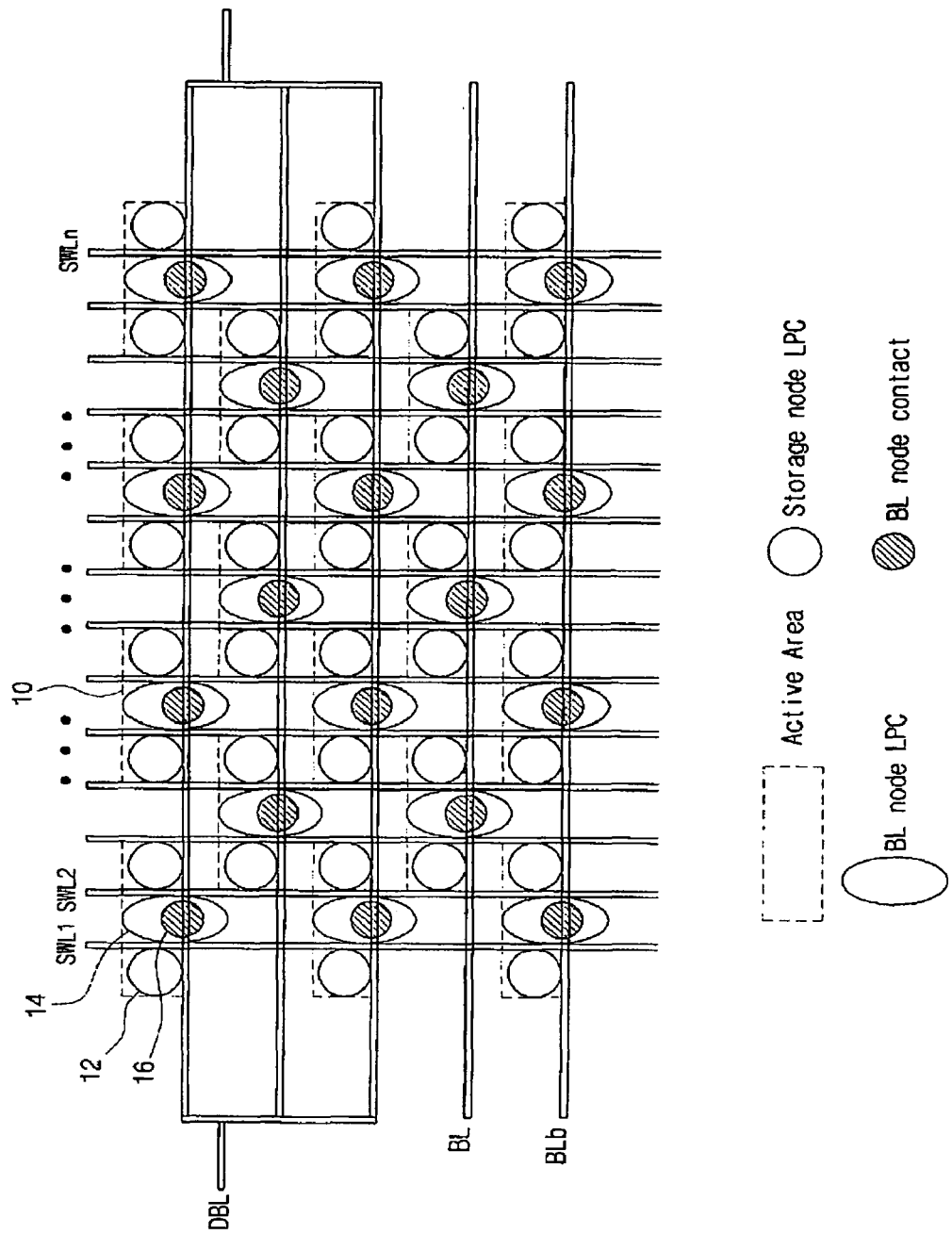
FIG. 1 is a layout of the cell array of a general memory device including a dummy bit line.
Figure 2:
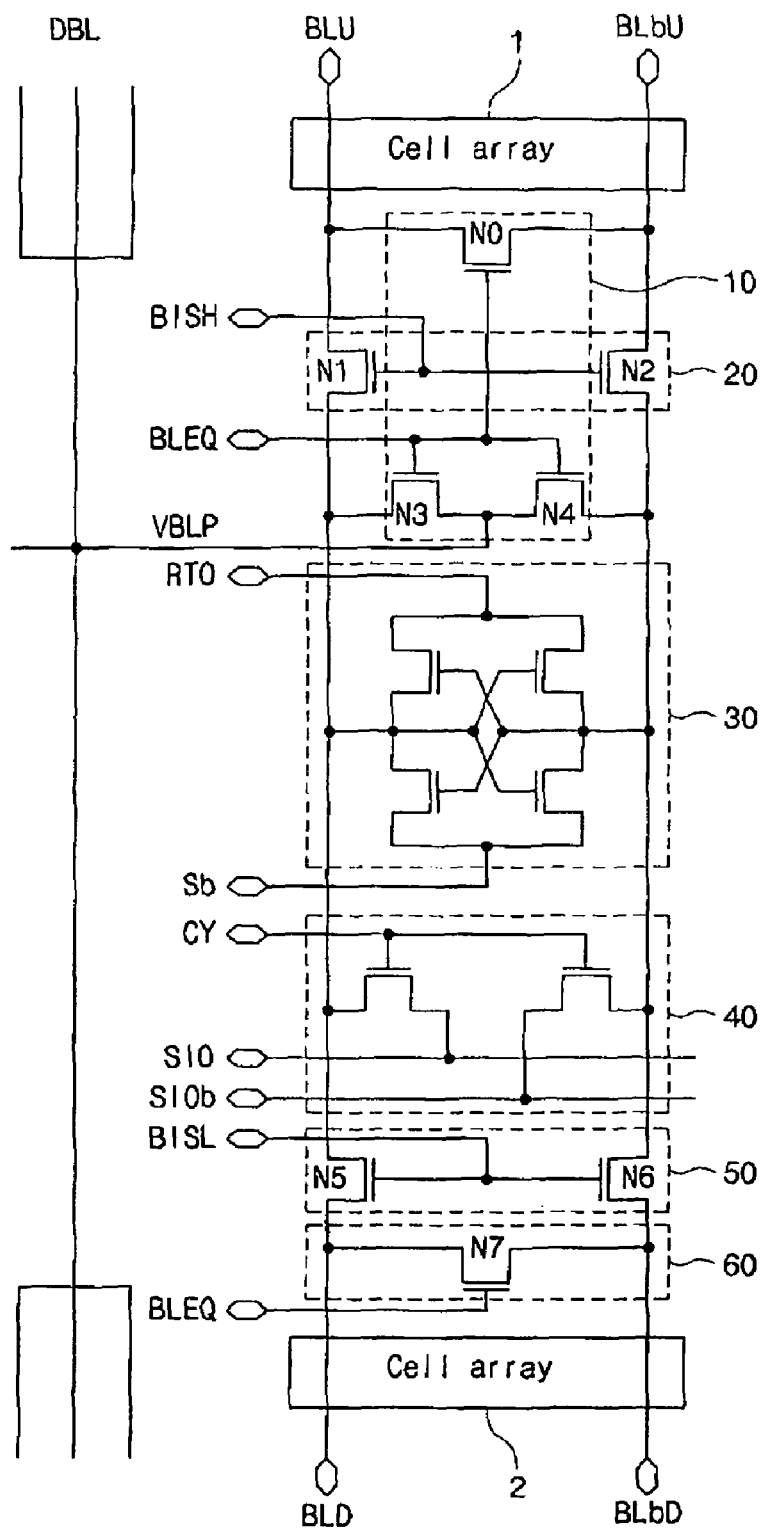
FIG. 2 is a circuit diagram illustrating a method of applying a voltage to the dummy bit line in accordance with the prior art.
Figure 3A:
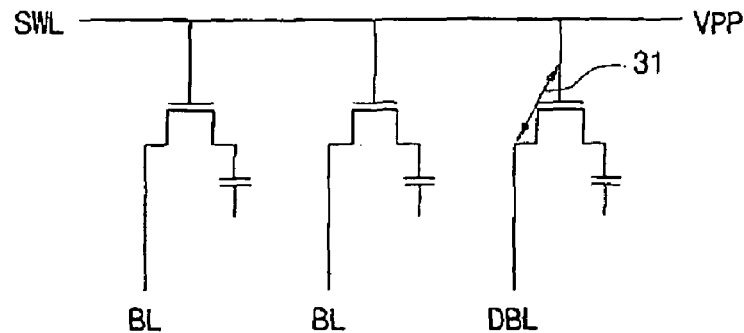
FIGS. 3A through 3C are examples of defects which may be generated in the prior art.
Figure 3B:
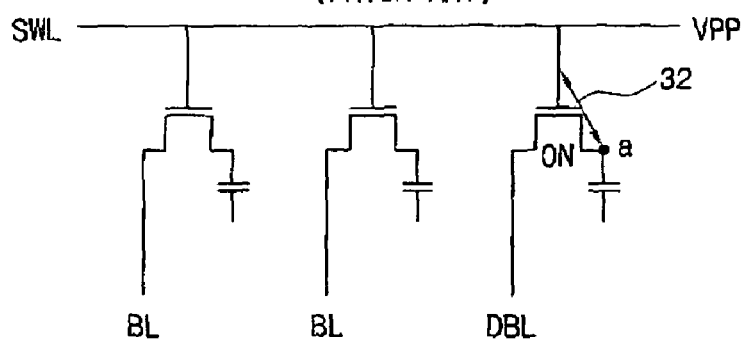
Figure 3C:
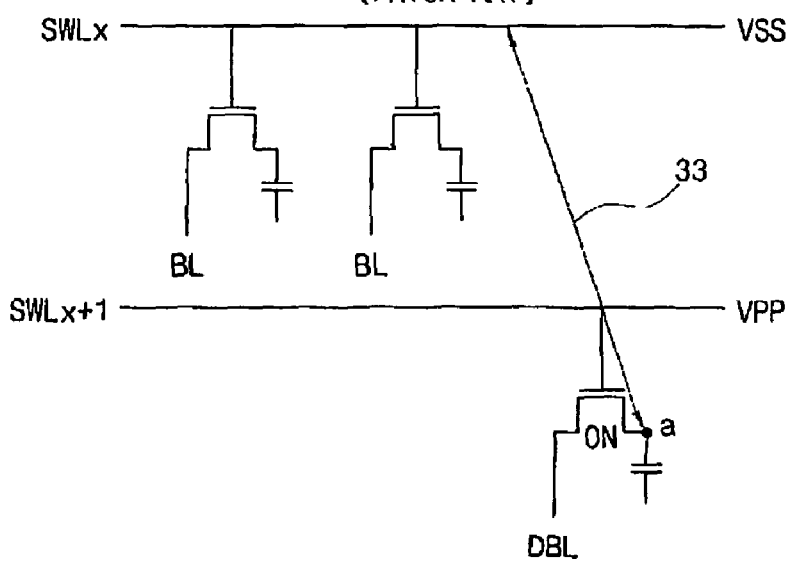
Figure 4:
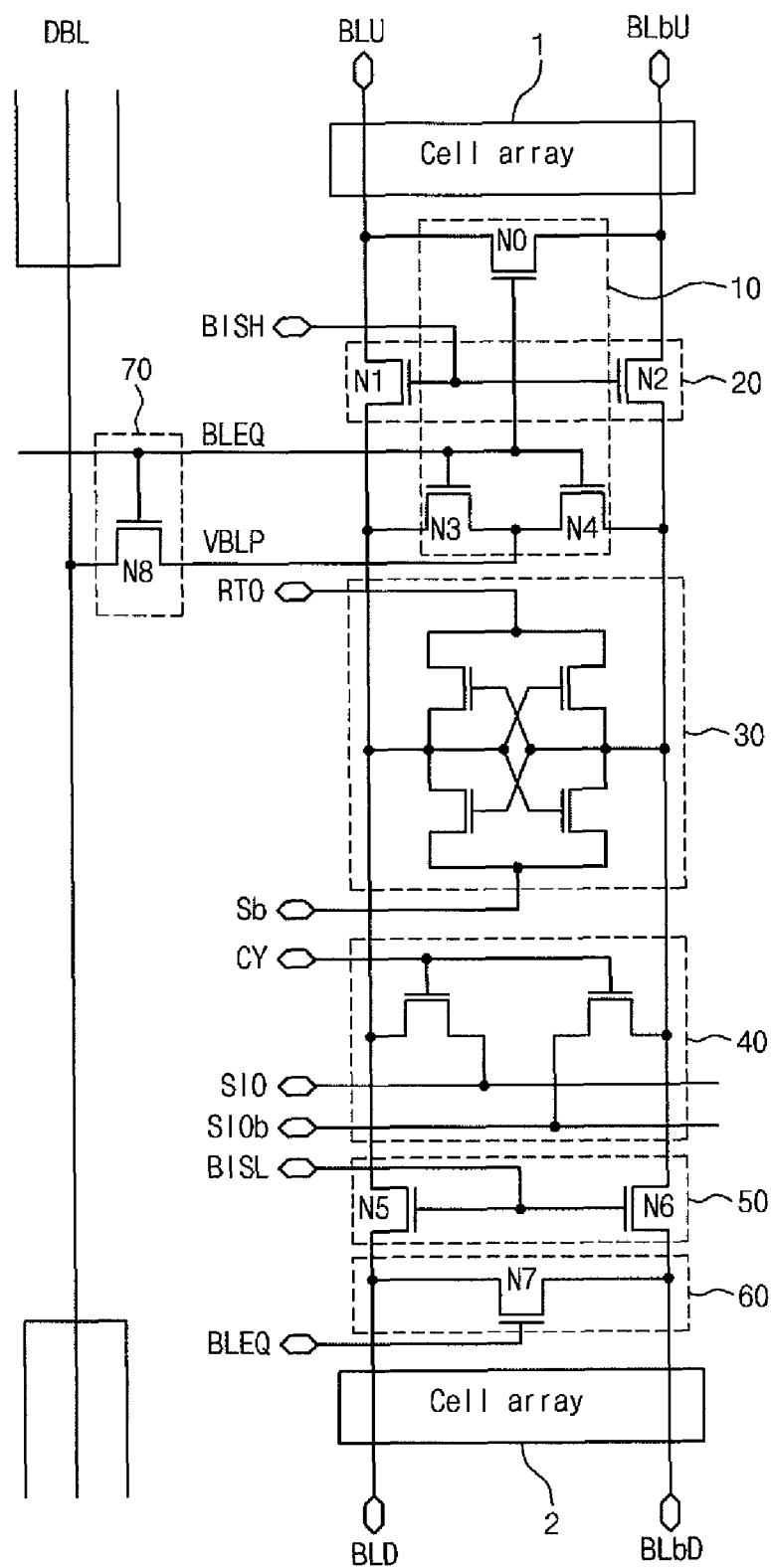
FIG. 4 is a circuit diagram illustrating a method of applying a voltage to the dummy bit line in accordance with an embodiment of the present invention.

FIG. 4 is a structural diagram illustrating a memory device in accordance with an embodiment of the present invention.

Referring to FIG. 4, a memory device in accordance with an embodiment of the present invention is provided with a bit line sense amplifier 30 which amplifies data on the bit line pair of a block connected to either an upper cell array 1 disposed at an upper portion thereof or a lower cell array 2 disposed at a lower portion thereof; an upper bit line isolation unit 20 which selectively isolates the bit line sense amplifier 30 and bit line pair BL and BLb of the upper cell array 1 in response to an upper bit line isolation signal BISH; a lower bit line isolation unit 50 which selectively isolates the bit line sense amplifier 30 and bit line pair BL and BLb of the lower cell array 2 in response to a lower bit line isolation signal BISL; an upper bit line equalization/precharge unit 10 which equalizes and precharges the bit line pair of the upper cell array 1 in response to a bit line equalization signal BLEQ; a lower bit line equalization unit 60 which equalizes the bit line pair of the lower cell array 2 in response to the bit line equalization signal BLEQ; and a switching unit 70 which controls the voltage applied to a dummy bit line.

Meanwhile, though it is not a circuit directly related to the sense amplification of the bit line, a column selection unit 40 which connects selectively the bit line pair BL and BLb and segment data bus pair SIO and SIOb in response to a column selection signal CY is disposed together with the bit line sense amplifier 30 between the upper bit line isolation unit 20 and the lower bit line isolation unit 50

Herein, the bit line sense amplifier 30 is, although there exists various types, generally provided with two PMOS transistors connected between a pull-up power line RTO and the bit line pair BL and BLb and two NMOS transistors connected between a pull-down power line Sb and the bit line pair BL and BLb.

Also, the column selection unit 40 includes two NMOS transistors which selectively connect the bit line pair BL and BLb and segment data bus pair SIO and SIOb using the column selection signal CY as a gate input.

Further, the upper bit line isolation unit 20 includes two NMOS transistors N1 and N2 which connect/isolate the bit line sense amplifier 30 and the upper bit line pair BLU and BLbU using an upper bit line isolation signal BISH as a gate input.

Furthermore, the lower bit line isolation unit 20 includes two NMOS transistors N5 and N6 which connect/isolate the bit line sense amplifier 30 and the lower bit line pair BL and BLb using a lower bit line isolation signal BISL as a gate input.

In addition, the upper bit line equalization/precharge unit 10 is provided with NMOS transistors N3 and N4 which precharge the bit line pair BL and BLb to a bit line precharge voltage VBLP (generally, Vdd/2) using the bit line equalization signal BLEQ as a gate input and an NMOS transistor N0 which equalizes the upper bit line pair BLU and BLbU using the bit line equalization signal BLEQ as a gate input.

In addition, the lower bit line equalization unit 60 is provided with an NMOS transistor N7 which equalizes the lower bit line pair BLD and BLbD using the bit line equalization signal BLEQ as a gate input.

The switching unit 70 is provided with an NMOS transistor N8 which switches the precharge voltage VBLP to the dummy bit line using the bit line equalization signal BLEQ as a gate input.

Applying power to the dummy bit line and an on/off operation of the switching unit 70 will now be described. In a precharge state, since the bit line equalization signal BLEQ, the lower bit line isolation signal BISL and the upper bit line isolation signal BISH are all in a high level state, the NMOS transistors N0 through N7 are all maintained in a turned on state. At this time, since the high level equalization signal BLEQ is also inputted into a gate of the NMOS transistor N8 of the switching unit 70, the NMOS transistor N8 is also in a state of turn on. Therefore, the precharge voltage is supplied to the dummy bit line. In other words, the operation is the same as the prior art in the precharge state.

In this state, when an active command is applied, the upper bit line isolation signal BISH or the lower bit line isolation signal BISL is enabled. For example, when the upper bit line isolation is enabled, the NMOS transistors N1 and N2 which use the upper bit line isolation signal BISH as a gate input is maintained in a turned on state and the lower bit line isolation signal BISL is inactivated at a low level to turn off the NMOS transistors N5 and N6. At this time, the bit line equalization signal BLEQ is disabled to turn off the NMOS transistors N0, N3, N4 and N7. Therefore, the normal bit line pair BL and BLb is floated with the precharge voltage VBLP. The active state refers to a state in which cell data selected in a memory cell array is applied to the bit line and the precharge state refers to the contrary case.

At this time, since the equalization signal supplied to the NMOS transistor N8 of the switching unit 70 is also at a low level, the NMOS transistor N8 is turned off and the supply of the precharge voltage VBLP supplied to the dummy bit line is also cut off. Therefore, the dummy bit line can be maintained in the floated state as is the normal bit line pair BL and BLb.

In other words, during active operation, the supply of the precharge voltage VBLP is cut off to both the normal bit line pair and the dummy bit line. Therefore, lowering of the voltage of the word line voltage VPP does not occur even though the LPC short defect as described above is generated in the dummy area to generate a leakage path between the word line and the dummy line.

According to the prior art, since the precharge voltage VPP is supplied to the dummy bit line during the active operation, a problem is created allowing that when the LPC short defect is generated, the conflict between the word line driving voltage VPP and the bit line precharge voltage VBLP is generated to lower the word line voltage VPP. However, according to the present invention, since the dummy bit line is floated from the VBLP even when the LPC short defect is generated, the conflict between the word line voltage VPP and the bit line precharge voltage VBLP does not occur and thus the lowering of the word line driving voltage VPP is not generated. Likewise, the voltage Vss is not raised in the disabled word line.

As described above, according to the present invention, it is possible to cut off the precharge voltage supply when an active command is applied by controlling the power supplied to the dummy bit line.

Also, according to the present invention, it is possible to solve the problems generated by the defect in the LPC process. For, example, it is possible to prevent the word line driving voltage VPP from being lowered or the disabled word line voltage VSS from being raised when a short is generated between the word line and the dummy bit line.

Therefore, according to the present invention, it is possible to prevent an Ioff defect, which may be generated due to the LPC short defect.

Also, according to the present invention, since the dummy bit line is realized, using a small NMOS transistor without a large increase in the layout, to operate the same operation as the normal bit line when the active and precharge commands are applied and thus a sub word line driving ability is still maintained, it is possible to prevent the generation of a defect in a normal cell even though a short defect is generated in the dummy area.

Those skilled in the art will appreciate that the specific embodiments disclosed in the foregoing description may be readily utilized as a basis for modifying or designing other embodiments for carrying out the same purposes of the present invention. Those skilled in the art will also appreciate that such equivalent embodiments do not deunit from the spirit and scope of the invention as set forth in the appended claims.

What is claimed is:

1. A semiconductor memory device, comprising:
   a dummy bit line disposed in a cell array; and
   a switching unit coupled to the dummy bit line for switching a bias voltage to the dummy bit line by a control signal related to an operation of the cell array,
   wherein the switching unit includes an NMOS transistor which forms a common gate with an equalization transistor which equalizes a normal bit line pair disposed in the cell array.

2. The semiconductor memory device as set forth in claim 1, wherein the switching unit is turned off when an active command is applied to the cell array.

3. The semiconductor memory device as set forth in claim 1, wherein the switching unit is turned on when a precharge command is applied to the cell array.

4. The semiconductor memory device as set forth in claim l, wherein the control signal, which is activated to a high level when a precharge command is applied to the cell array, is applied to a gate of the NMOS transistor and the bias voltage is applied to a drain or a source of the NMOS transistor.

5. The semiconductor memory device as set forth in claim 4, wherein the control signal which is applied to the gate is a bit line equalization signal.

6. The semiconductor memory device as set forth in claim 4, wherein the bias voltage is a precharge voltage.

7. The semiconductor memory device as set forth in claim 1 wherein the NMOS transistor is disposed between the dummy bit line and the normal bit line.

8. A semiconductor memory device, comprising a cell array and a voltage supply unit,
wherein the cell array includes a switching unit coupled to a dummy bit line disposed in the cell array for switching a bias voltage, from the voltage supply unit, to the dummy bit line,
wherein the switching unit includes an NMOS transistor which forms a common gate with an equalization transistor which equalizes a normal bit line pair disposed in the cell array.

9. The semiconductor memory device as set forth in claim 8, wherein the switching unit is turned off to cut off the supply of the bias, voltage to the dummy bit line when an active command is applied to the cell array.

10. The semiconductor memory device as set forth in claim 8, wherein the switching unit is turned on to allow the bias voltage to be supplied to the dummy bit line when a precharge command is applied to the cell array.

11. The semiconductor memory device as set forth in claim 8, wherein a control signal which is activated to a high level is applied to a gate of the NMOS transistor when a precharge command is applied to the cell array and the bias voltage is applied to a drain or a source of the NMOS transistor from the voltage supply unit.

12. The semiconductor memory device as set forth in claim 11, wherein the control signal which is applied to the gate is a bit line equalization signal.

13. The semiconductor memory device as set forth in claim 8, wherein the NMOS transistor is disposed between the dummy bit line and the normal bit line.

14. The semiconductor memory device as set forth in claim 8, wherein the voltage supply unit supplies a precharge voltage.

15. A semiconductor memory device, comprising:
a cell array;
a dummy bit line disposed in the cell array;
a voltage supply unit which supplies a voltage to the dummy bit line; and
a switching unit coupled between the voltage supply unit and the dummy bit line and switches the voltage supplied to the dummy bit line,
wherein the switching unit includes an NMOS transistor which forms a common gate with an equalization transistor which equalizes a normal bit line pair disposed in the cell array.

16. The semiconductor memory device as set forth in claim 15, wherein the switching unit is turned off to cut off the voltage supply to the dummy bit line when an active command is applied to the cell array.

17. The semiconductor memory device as set forth in claim 15, wherein the switching unit is turned on to allow the voltage to be supplied to the dummy bit line when a precharge command is applied to the cell array.

18. The semiconductor memory device as set forth in claim 15, wherein the switching unit is controlled to be turned on or off by a control signal related to an operation of the cell array.

19. The semiconductor memory device as set forth in claim 15, wherein the switching unit includes the NMOS transistor provided with a gate to which a control signal is applied, the control signal being activated to a high level when a precharge command is applied to the cell array, and a drain or a source to which the voltage of the voltage supply unit is applied.

20. The semiconductor memory device as set forth in claim 15, wherein the voltage supply unit supplies a precharge voltage.

* * * * *